United States Patent [19]
Beilin et al.

[11] Patent Number: 5,454,161
[45] Date of Patent: Oct. 3, 1995

[54] THROUGH HOLE INTERCONNECT SUBSTRATE FABRICATION PROCESS

[75] Inventors: Solomon I. Beilin, San Carlos; Michael G. Peters, Santa Clara; Michael G. Lee, San Jose; Wen-chou V. Wang, Cupertino, all of Calif.

[73] Assignee: Fujitsu Limited, Japan

[21] Appl. No.: 54,899

[22] Filed: Apr. 29, 1993

[51] Int. Cl.⁶ .................................................. H01K 3/10
[52] U.S. Cl. ........................... 29/852; 29/829; 29/840; 264/61
[58] Field of Search .................. 264/61; 29/829, 29/830, 840, 846, 852; 427/96, 97; 437/208

[56] References Cited

U.S. PATENT DOCUMENTS

| | | | |
|---|---|---|---|
| 3,352,730 | 11/1967 | Murch, Jr. ............................. | 29/846 |
| 3,791,858 | 2/1974 | McPherson et al. . | |
| 4,348,253 | 9/1982 | Subbarao et al. ..................... | 156/643 |
| 4,417,393 | 11/1983 | Becker .................................. | 29/846 |
| 4,528,072 | 7/1985 | Kurosawa et al. .................... | 204/15 |
| 4,799,984 | 1/1988 | Rellick ................................. | 29/829 X |
| 4,806,188 | 2/1989 | Rellick ................................. | 264/6.1 X |
| 4,808,273 | 2/1989 | Hau et al. ............................. | 204/15 |
| 4,810,332 | 3/1989 | Pan ....................................... | 204/15 |
| 4,868,068 | 9/1989 | Yamaguchi et al. .................. | 428/596 |
| 4,875,982 | 10/1989 | Velie .................................... | 204/14 |
| 4,880,684 | 11/1989 | Boss et al. ........................... | 264/61 X |
| 4,938,996 | 7/1990 | Ziv et al. ............................. | 427/53.1 |
| 5,069,749 | 12/1991 | Gutierrez ............................. | 156/646 |
| 5,100,501 | 3/1992 | Blumenthal et al. ................. | 156/643 |

FOREIGN PATENT DOCUMENTS

| | | | |
|---|---|---|---|
| 2-83995 | 3/1990 | Japan .................................... | 29/829 |
| 2-230798 | 9/1990 | Japan .................................... | 29/829 |
| 3-150895 | 6/1991 | Japan .................................... | 29/829 |
| 3-194876 | 8/1991 | Japan .................................... | 29/829 |
| 3-194875 | 8/1991 | Japan .................................... | 29/829 |
| 3-270292 | 12/1991 | Japan .................................... | 29/829 |
| 4-19972 | 1/1992 | Japan .................................... | 29/829 |
| 1321010 | 6/1973 | United Kingdom ................... | 29/829 |

OTHER PUBLICATIONS

IBM Technical Disclosure Bulletin vol. 21 No. 6 Nov. 1978 pp. 2270–2271 by J. M. Kolly et al.

*Primary Examiner*—Carl J. Arbes
*Attorney, Agent, or Firm*—Christie, Parker & Hale

[57] ABSTRACT

A high density through-hole interconnect with high aspect ratio vias is formed by sequentially forming layers of dielectric material on a previous dielectric layer. After each layer is formed, a plurality of through holes are etched through each layer and filled or metalized with an electrically conductive material having a coefficient of thermal expansion matching that of the dielectric layers and the integrated circuit that it will connect with. Preferably, the process of forming dielectric layers, forming through holes, and metalizing the through holes is repeated until the metalized through holes have an aspect ratio in the range of from 6 to 10. A support structure is constructed to interconnect with and support the metalized vias while the dielectric material is removed. A second dielectric material having the desired mechanical and electrical properties is poured into the support structure to fill the space between the metalized vias and allowed to solidify. The support structure is removed and the through-hole interconnector, comprising the metalized vias and the second dielectric material, is lapped and polished to predetermined manufacturing dimensions and tolerances.

26 Claims, 6 Drawing Sheets

THROUGH HOLE INTERCONNECT SUBSTRATE FABRICATION PROCESS

FIELD OF THE INVENTION

The present invention relates generally to the interconnection of electronic signals between multiple circuit boards. In particular, the present invention provides a means of interconnection characterized by having extreme signal density and high aspect ratios.

BACKGROUND OF THE INVENTION

In computer applications, a number of multi-chip modules (MCM) may be interconnected by using a through-hole interconnector. High performance computers require the interconnection of a large number of MCMs by an interconnector which can facilitate the passage of electrical signals at a high rate of speed. In order to accommodate such a large number of MCMs and the desired rate of signal transfer, the interconnectors must be manufactured having precise dimensions and tolerances. The precise tolerances of the interconnector are required to ensure the connection and efficient passage of the electrical signal through the interconnector to and from the MCM. The most important interconnector dimension and tolerance is that of the electrical interconnects. The electrical interconnects are the electrically conductive portion of the conductor which mates with the MCM and facilitates the transfer of electrical signals.

Through-hole interconnectors used in the art are commonly made from a dielectric material such as plastic or rubber and the like comprising a conductive portion, i.e., electrical interconnects, to accommodate the MCM. Interconnectors made from such dielectric materials, because of their flexible construction, are not rigid enough to permit their use in high performance computer applications where precise dimensions and tolerances are required. The use of such a flexible interconnector can result in the improper alignment and mating of the electrical interconnects with MCMs, circuit boards, or integrated circuit devices. Additionally, such flexible interconnectors are unable to maintain their dimensional integrity under conditions of applied force. The applied forces may be the result of either thermal stresses, caused by thermal cycling, or by the use of pressure contacts.

The electrical connection between the interconnector and the MCM or circuit board is generally made by solder joint, soldering the electrically conductive portion of the MCM or circuit board to the interconnector's complementary electrical interconnects. This method of joining the interconnector and MCM or circuit board requires that the solder joint be melted in order to separate the two members. The need to melt the solder joint in order to remove a single failed MCM or circuit board from a interconnector may not be practical in an application such as a high performance computer where the failed MCM or circuit board may be difficult to access due the proximity of surrounding MCMs or circuit boards.

The advent of high performance computers creates a greater need for interconnectors that are capable of accommodating a large number of components, i.e., MCMs, integrated circuits, circuit boards and the like, (high-density interconnector). The interconnector should also accommodate such components in a manner which maximizes both the electrical conductivity between the interconnector and the connecting electrical component, and the mechanical reliability of the electrical connection, so as to facilitate the rapid transfer of electrical signals through the interconnector.

High density through-hole interconnectors are known in the art. Such interconnectors are capable of accommodating multiple components by the nature of their construction, namely, a dielectric substrate comprising a plurality of electrical interconnects. Such interconnectors are manufactured by forming a plurality of holes through the dielectric substrate and subsequently filling the holes with an electrically conductive material. The filled holes form the electrical interconnect and are characterized by their aspect ratio, defined as the depth or length of the electrical interconnect divided by the diameter of the electrical interconnect. In order to accommodate the increased circuit density of integrated circuits used in computer construction, it is desirable that the interconnector possess a large number of electrical interconnects, or have a high electrical interconnect density.

An interconnector comprising electrical interconnects having a high aspect ratio allows for a greater number of electrical interconnects per a given interconnector (high density), and thereby allows the interconnector to accommodate a larger number of MCMs, integrated circuits, circuit boards and the like.

Interconnectors with electrical interconnects having a high aspect ratio are known in the art. Such interconnectors are manufactured by the method of forming a dielectric substrate of given thickness and then forming a pattern of holes by methods well known in the art such as drilling, punching, chemical etching and the like. The holes then filled with an electrically conductive material (metalized) to form the electrical interconnect. Interconnectors manufactured according to this method comprise electrical interconnects having an aspect ratio up to about two. In order to accommodate the circuit density of integrated circuits used in the construction of high powered computers it is desired that the interconnector comprise electrical interconnects having an aspect ratio greater than about four.

Through-hole interconnectors with electrical interconnects having an aspect ratio greater than about two are difficult to manufacture according to known methods because the through hole forming tool must necessarily be relatively long and narrow, making it unstable and difficult to control during the hole forming step. During the hole forming process, the inherent instability of using such a tool either causes the deformation or misalignment of the hole or causes the tool to break. The difficulty of forming interconnector through holes using such known methods effectively limits the ability to obtain electrical interconnects having aspect ratios greater than about two.

Through-hole interconnectors must also facilitate the high speed transfer of electrical signals to and from the integrated circuit or other electrical component that it is connected to. The electrical interconnects should, therefore, be constructed so that they have low resistance and have good electrical conductivity. According to known methods, electrical interconnects are typically formed by filling the pattern of holes made in the dielectric substrate by flowing a molten conductive material into the hole (metalizing). As the dimensions of the hole become smaller for greater circuit densities, and as the aspect ratio increases, the molten conductive material flowing into the hole begins to deposit about the inner wall of the hole. As the conductive material deposited about the wall of the hole solidifies, it acts to reduce the diameter of the hole, and thereby inhibits further flow of the molten conductive material down into the hole. As the diameter progressively decreases during the filling process, the through hole eventually becomes sealed at both ends, thereby creating a void in the center of the hole. Since these voids by definition lack conductive material, their presence causes high resistance areas in the electric interconnect which in turn may result in the improper operation of an electrical component connected to the interconnector.

The method of filling the through holes with molten conductive material (metalization) also limits the materials which can be used to either metals or alloys of metals. Metal-nonmetal compositions can not be used. Generally speaking, metals are desirable electrical connectors because of their high electrical conductivity. However, metals also have thermal expansion characteristics that are different (typically higher) than that of dielectric material. In the construction of interconnectors it is desirable that the material selected for the electrical interconnect have thermal expansion characteristics similar to or matching that of the surrounding dielectric substrate and the integrated circuit or other electrical components that it will connect with. The ability to match coefficients of thermal expansion is desirable because differences in thermal expansion characteristics between connected components cause thermal stresses to develop between them which may eventually lead to reliability problems in their connection, ultimately resulting in mechanical failure.

It is, therefore, desirable that through-hole interconnectors used in the construction of high performance computers have precise dimensions in order to facilitate the accurate placement of MCMs, integrated circuits, circuit boards and the like. It is also desirable that the interconnector be constructed with electrical interconnects having a high aspect ratio, thus allowing the interconnector to accommodate integrated circuits and the like having high circuit densities. It is desirable that the interconnector be capable of employing various contact schemes, but particularly, one which would permit easy configuration changes. It is also desirable that the method of manufacturing such high density interconnectors be both practical and economically feasible.

It is desirable that the interconnector be manufacture with electrical interconnects having a high electrical conductivity and low resistance to facilitate the rapid transfer of electrical signals. It is also desirable that the interconnector be constructed with electrical interconnects having thermal expansion characteristics similar to those of the nonconductive interconnector substrate and the integrated circuits or electrical components that it will connect with.

SUMMARY OF THE INVENTION

There is, therefore, provided in practice of this invention according to a presently preferred embodiment, a method for manufacturing a high density through-hole interconnector with electrical interconnects having an aspect ratio in the range of from 1 to 10. The through-hole interconnector is manufactured by depositing a conductive seed layer onto the surface of a base substrate. A layer of dielectric material is applied to the surface of the conductive seed layer and a plurality of through holes and post holes are formed in the dielectric layer. The plurality of through holes are filled in or metalized to form vias by electroplating or metal organic chemical vapor deposition with a conductive material having a coefficient of thermal expansion matching that of a final dielectric material and the integrated circuits or electrical components that the interconnector will connect with. The post holes are metalized with a conductive material to form conductive posts. The conductive material chosen to metalize the post holes may be the same as that used to form the vias or may be any other type of electrically conductive material. The dielectric layer undergoes chemical or mechanical polishing and the vias are tested for electrical conductivity to ensure the void free hermetic metalization of the through holes.

The steps of applying a dielectric layer, forming a plurality of holes, metalizing the plurality of holes, and testing the holes are repeated until the vias have an aspect ratio, defined as the length of the via divided by the diameter of the via, in the range of from one to ten, a preferred aspect ratio being in the range of from six to ten.

A via support structure is formed by depositing conductive material, which interconnects with the conductive posts and the terminal portion of the plurality of vias, onto the surface of a last dielectric layer. The dielectric layers are removed, leaving an interconnector frame comprising the via support structure, the vias, the conductive seed layer, and the base substrate. The interconnector frame is filled and covered with a final dielectric material having the desired interconnector mechanical and electrical properties. The via support structure, base substrate, and conductive seed layer are cut away from the filled interconnector frame. The surfaces of the interconnector are lapped and polished to the desired manufacturing dimensions and tolerances.

The method of the present invention may be used to manufacture a high density through-hole interconnector having only one dielectric layer by forming a plurality of through holes in a single layer of dielectric material having the desired electrical and mechanical properties. A conductive seed layer is applied to one surface of the dielectric layer and the plurality of holes are metalized with a conductive material having a coefficient of thermal expansion that matches dielectric material and the integrated circuit that the through-hole connector will connect with. The conductive seed layer is removed to form the completed through-hole interconnector.

The through-hole interconnector manufactured according to this invention comprises vias which serve as the interconnector's electrical interconnects. The vias are precisely aligned within the interconnector and have a high aspect ratio which can accommodate connection with integrated chips of high circuit density. The method of filling or metalizing the vias by electroplating or metal organic chemical vapor deposition ensures the void free hermetic metalization of the vias, maximizing the vias ability to transfer electrical signals through the interconnector. Finally, the method of metalizing the through holes using conductive materials having coefficients of thermal expansion matching that of the surrounding dielectric layer and the connecting electrical components minimizes the occurrence of mechanical failure due to thermal stresses.

BRIEF DESCRIPTION OF THE DRAWINGS

These and other features and advantages of the present invention will become appreciated as the same becomes better understood with reference to the specification, claims and drawings wherein:

DETAILED DESCRIPTION

Figure 1:
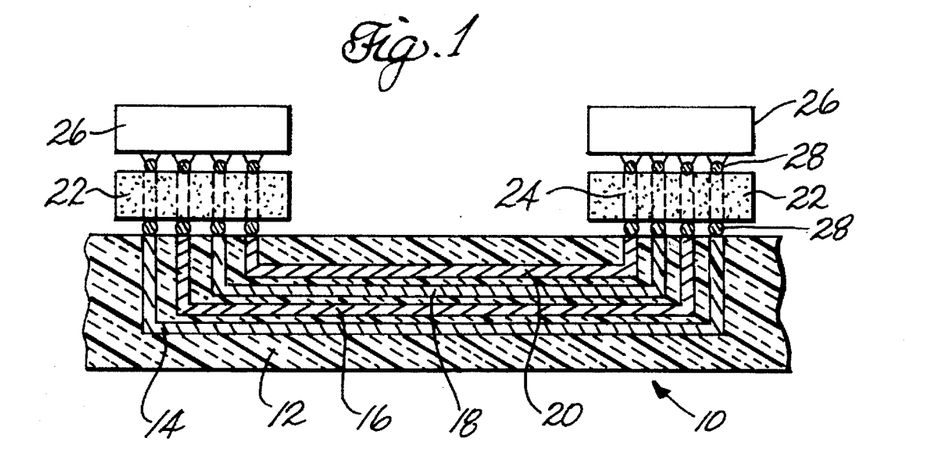
FIG. 1 is a cross sectional view of a multi-chip module using a high density through-hole interconnect substrate manufactured according to principles of the invention.

FIG. 1 shows a cross sectional view of a multi-chip module using a high density through-hole interconnect substrate constructed according to principles of the invention. A multi-chip module (MCM) 10 comprises a multi-layer interconnection substrate 12 having four signal traces 14, 16, 18, and 20 for communicating electrical signals between each integrated circuit 26 (although computers typically employ thousands of signal traces, only four are illustrated for purposes of simplicity and clarity). The interconnection substrate 12 preferably comprises a multi-layer ceramic dielectric body portion having electrical interconnects for transferring an electric signal. Alternatively, the interconnection substrate may comprise a printed wiring board.

A through-hole interconnector 22, as constructed according to present invention is used to connect the terminal portions of the signal traces 14, 16, 18, and 20 to the terminal portion of an integrated circuit 26. The through-hole interconnector 22 is a high density through-hole interconnect substrate that serves to transfer electrical signals between the integrated circuit 26 and the base interconnection substrate 12. With respect to FIG. 1, the top surface of the through-hole interconnector is directed toward a mating surface of the integrated circuit 26 and the bottom surface of the through-hole interconnector is opposite to the top surface and directed toward a mating surface of the interconnection substrate 12.

Figure 2:
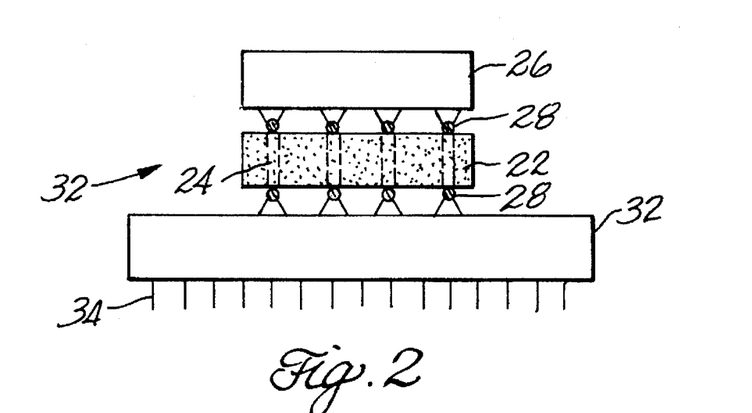
FIG. 2 is a cross sectional view of a pin grid array chip carrier using a high density through-hole interconnect substrate manufactured according to principles of the invention.

The through-hole interconnector comprises a dielectric layer or plurality of layers 42 and a plurality of vias 24 which comprise through holes 40 filled with a conductive material and serve as the electrical interconnects to facilitate the transfer of electrical signals through the dielectric layer. As shown in FIGS. 1 and 2, the vias 24 extend vertically through the dielectric body between the top surface and the bottom surface of the interconnector. The vias are configured in a parallel relation to each other and may be arranged having a uniform pitch or any desired spacing for a particular purpose. Each via has two terminal end portions, one end located at the top interconnector surface and the other end located at the bottom interconnector surface. The end portions of each via are connected to the integrated circuit 26 and the signal traces of the interconnection substrate 12 by contact pads 28. The contact pads preferably comprise a conductive solder material that when melted flows to create an electrical connection between the via end and the corresponding integrated circuit or signal trace. Alternatively, the contact pad may comprise soft gold where electrical contact is produced by applying pressure between the interconnection substrate 12 and the through-hole interconnector 22 or between the through-hole interconnector 22 and the integrated circuit 24.

FIG. 2 is a cross sectional view of a pin grid array module using the high density through-hole interconnect substrate connector as constructed according to the present invention. A pin grid array module 30 provides an electrical translation for electrical signals from an integrated circuit 26 to a pin grid array housing 32 which is well known to those skilled in the art. The pin grid array module 30 comprises a pin grid array pin housing 32 that supports pins 34 that are arranged in an array corresponding to an array of receptacles contained in a conventional socket connector which is typically mounted on a printed circuit board. In a manner similar to that shown for the multi-chip module 10 in FIG. 1, a through-hole interconnector 22 is connected to the pin grid array housing 32 by contact pads 28. An integrated circuit 26 is similarly connected to the interconnector 22 by contact pads 28 as described for the MCM in FIG. 1. The pin grid array housing 32 provides an electrical translation from the small spacing between the vias 24 of the through-hole interconnector 22 to a wider spacing of the pins 34 of the pin grid array 32.

In order to construct a computer having increased power in terms of data handling capacity, the circuit density internal to the integrated circuit 26 must necessarily be increased. This increase in circuit density requires that the size of the leads on the integrated circuit become smaller and their spacing more compact. In order to accommodate the electrical connection with the leads of such an integrated circuit, the interconnecting substrate must be constructed having a corresponding decrease in the size and spacing of its electrically conductive vias 24. This reduction in the size and spacing or pitch of the vias contained within a through-hole interconnect substrate is accomplished by manufacturing the interconnector with vias having a high aspect ratio. For a through-hole interconnect substrate, the aspect ratio is defined as the thickness of the interconnect substrate (the depth or length of the via) divided by the diameter of the via. A high aspect ratio is needed since the interconnector must have reasonable thickness to have adequate strength. The close spacing of the electrical vias also means that they must have a very small diameter. A through-hole interconnect substrate with vias having a high aspect ratio can accommodate more vias per given area then one with vias having a low aspect ratio, and therefore is referred to as being a high density interconnect substrate.

Figure 3:
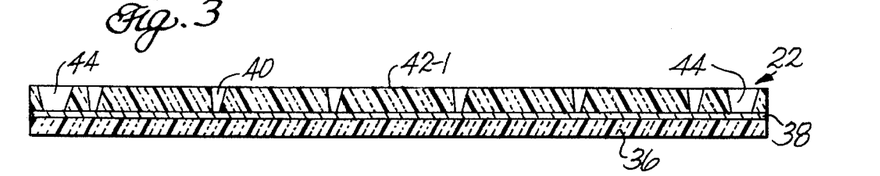
FIG. 3 is a cross sectional view of a first layer of a preferred embodiment of the high density through-hole interconnect substrate manufactured according to principles of this invention.

Turning now to the method of constructing the high density through-hole interconnector 22, reference is made to FIGS. 3–13. Referring in particular to FIG. 3, a conductive seed layer 38 is deposited on the top surface of a dielectric base substrate 36 by methods well known in the art such as sputtering, chemical vapor deposition and the like. The conductive seed layer may be selected from the group consisting of pure metals, alloy metals, conductive polymers, and graphite. The conductive seed layer serves to facilitate the metalization of interconnector through holes 40 by deposition techniques well known to those skilled in art.

A first dielectric layer 42-1 is deposited on the top surface of the conductive seed layer 38, as shown in FIG. 3. As will be described below, the dielectric layer 42 may be subsequently removed and replaced by a different final dielectric material 52 depending on the mechanical and electrical requirements of the completed interconnector 22. Thus, the choice of material for the first dielectric layer 42-1 may account for facilitating the manufacturing process rather than meeting the mechanical and electrical requirements of the completed product. A preferred first dielectric layer may be selected from the group of nonconductive materials consisting of organic or inorganic polymers, ceramics, glass, glass-ceramics, polyimide-epoxy, epoxy-fiberglass, Teflon and the like. A preferred first dielectric material may be polyimide or any other photo-etchable material.

The first dielectric layer 42-1 may be added to the conductive seed layer 38 by one of several conventional methods that are well known to those skilled in the art. A first method is called the spin method due to the spinning process that is used to distribute the dielectric material over the top surface of the conductive seed layer 38. The spin method is carried out by placing the dielectric material, which is in a liquid state, near the center portion of the top surface of the conductive seed layer 38. The dielectric base substrate 36 and the conductive seed layer is then rotated at a high rate to cause the dielectric material to spread across the top surface of the conductive seed layer 38 to form a thin dielectric layer of uniform thickness. In this process, the excess dielectric material simply spins off the layer. The spin method provides a typical dielectric material thickness of approximately 25 micrometers and is compatible with either organic or inorganic dielectric materials. After the dielectric material is dispersed, it is cured by exposure to radiation or elevated temperatures for an appropriate curing time for the material selected.

A second method for applying the first dielectric layer 42-1 involves the direct spraying of the liquid dielectric onto the conductive seed layer 38. In the spray method the liquid dielectric material is forced through the tip of a spray gun nozzle by pressurized air to create a stream of droplets that are propelled towards and impinge the surface of the conductive seed layer 38, thereby forming a layer of dielectric material on the surface of the conductive seed layer 52. A dielectric material thickness of approximately 25 micrometers may be achieved using such a spray technique. The spray method is typically used for the application of organic dielectrics. After the dielectric is applied it is cured by using well known methods similar to that described for the curing the dielectric layer applied by the spin method.

A third method for applying the first dielectric layer 42-1 is to use Corton coating. In this method, an organic material is extruded as a thin film across the top surface of the conductive seed layer 38. Either the extrusion nozzle or the conductive seed layer may be moved for the purpose of uniformly dispersing the dielectric material throughout the surface of the conductive seed layer. The Corton coating method is typically used to apply organic dielectric materials. After the dielectric material is applied it is cured by using well known methods similar to that used to cure the dielectric layer applied by the spin and spray method.

A plurality of through holes 40 are formed in the first dielectric layer 42-1. The through holes may be formed by methods well known in the art such as by drilling, punching, reactive ion etch, chemical etching and the like. A preferred method for forming the through holes is by using a photo etching process. The photo etching process is carried out by applying a uniform layer of a photoresist material to the surface of the first dielectric layer 42-1 and curing the photoresist material by well known methods. A photo mask having a plurality of circular openings is aligned to alignment marks (not shown) on the dielectric base substrate 36 and placed onto the surface of the photoresist material. The photo mask has a pattern corresponding to the desired quantity and pitch of the through holes to be formed in the first dielectric layer 42-1. This temporary subassembly is exposed to light, causing the photoresist material to develop in those areas not covered by the photo mask which serves to define the locations for the desired through holes 40. The developed areas are etched in a conventional manner. A chemical etching compound is applied through the developed areas of the photoresist to etch through the dielectric layer from its surface to the conductive seed layer 38.

The through holes formed according to this method are inherently in the shape of a truncated cone having a first diameter near the surface of the conductive seed layer 38 and a second diameter, which is larger than the first diameter, near the surface of the first dielectric layer. The conical configuration of the through holes are caused by the progressive decrease in etching efficiency as the etching compound travels from the surface of the dielectric layer through its thickness and slight undercutting of the photoresist as each hole is etched deeper. This undercutting limits the aspect ratio of a hole that can be etched.

Figure 4:
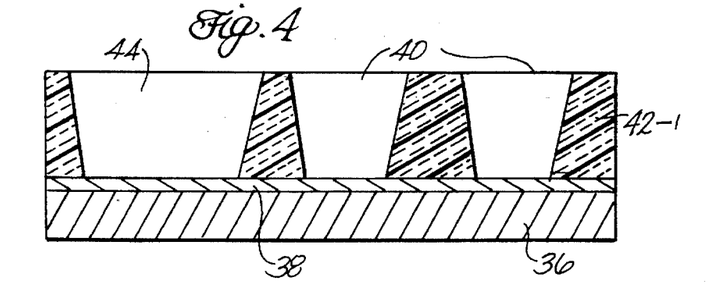
FIGS. 4 and 5 are enlarged cross sectional views of the first layer of the high-density through-hole interconnect substrate before and after a process of metalization.

FIG. 4 is a magnified view of the through-hole interconnect after the through holes 40 and post holes 44 have been formed in the first dielectric layer 42-1. This view clearly illustrates the conical configuration of the through hole caused by the photo etch process.

In the preferred embodiment, two different types of holes are formed in the dielectric layer. The first type of hole formed is the through hole 40 formed by the photo etching process. The through hole is formed so that it can be filled with conductive material or metalized to form a via 24 which serves as the electrical interconnect to facilitate the transfer of electrical signals though the dielectric layer 42. The number of through holes formed will depend on the particular interconnection requirements, i.e., the circuit density of the connecting integrated circuit.

The other type of hole formed in the dielectric layer is a post hole 44 which, in the preferred embodiment, is also filled with an electrically conductive material to form a conductive post 46 at each of the four corners of the though-hole interconnector 22. The conductive posts are formed for the purpose of providing a temporary via support structure 45, see FIG. 9. The conductive post holes may be formed using methods well known to those skilled in the art such as by laser drilling, punching, reactive ion etch, chemical etch and the like. However, the post holes 44 may also be formed by using the same photo etch technique that was used to form the through holes 40 for purposes of increasing manufacturing efficiency. The conductive posts 46 are sacrificial in nature and are not present in the final interconnector. In the preferred embodiment the number of conductive posts formed are four due to the rectangular configuration of the interconnector 22. However, the number of post holes ultimately depends on the configuration of the interconnector, i.e., round, rectangular, hexagonal and the like, as well as the particular quantity and pitch of the through holes 40.

Figure 5:
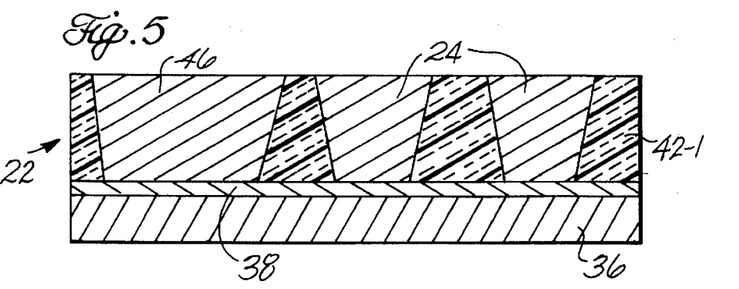

After forming holes 40 and 44 in the first dielectric layer 42-1, they are each filled with electrically conductive material during a step referred to herein as called metalization; see FIG. 5. The conductive material selected may include pure metals, metal alloys, combinations of metals and dielectrics and the like. With respect to the metalizing the through holes 40, the choice of which conductive material to select ultimately depends upon its electrical conductivity and the thermal expansion characteristics of the final dielectric material 52, the interconnection substrate 12 and the integrated circuit or circuits 26 that will electrically connect with the interconnector 22.

Thermal stresses often develop between electrical components in contact with each other during their operation, which may eventually lead to reliability problems in the connection between the components, ultimately resulting in mechanical failure. The thermal stresses are caused by connecting electrical components having different thermal expansion characteristics. Therefore, it is desirable that the conductive material selected to fill the through holes 40 have a coefficient of thermal expansion (CTE) approximately equal to that of the final dielectric material 52, the interconnection substrate 12, and the integrated circuit or circuits 26. Selecting a conductive fill material based on matching the CTE serves to eliminate the thermal stresses that may develop between interconnecting electrical components, and thus greatly improves the reliability of the electrical interconnection between the interconnection substrate 12 and the integrated circuit or circuits 26.

Figure 6:
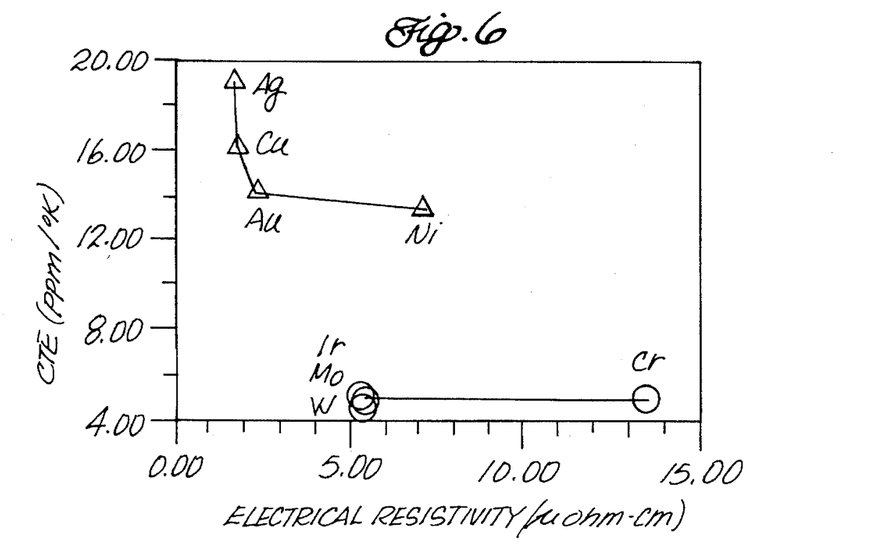
FIG. 6 is a graphical representation of suitable conductive materials for metalization showing the coefficient of thermal expansion and electrical resistivity for each.

While it is desirable to choose the conductive material used for through hole metalization based on matching thermal expansion characteristics, the material selected must simultaneously display a desired degree of electrical conductivity. FIG. 6 shows a graphical representation of preferred conductive materials identifying both the CTE and the electrical resistivity for each material. Final dielectric materials typically have a CTE in the range of from 2 to 10, i.e., silicon (CTE=2.6 ppm/°K.), aluminum nitride (CTE=4 ppm/°K.), alumina (CTE=6.3 to 6.8 ppm/°K.), gallium arsenide (CTE= 6.5 ppm/°K.) and glass-ceramic (CTE=10.3 ppm/°K.), which are lower than those of most well known conductive materials, i.e., metals and metal alloys.

Conductive metals having a high CTE include silver (CTE=19 ppm/°K.) copper (CTE=16 ppm/°K.), gold (CTE= 14 ppm/°K.) and nickel (CTE=13.6 ppm/°K.). Conductive metals having a relatively low CTE include tungsten, molybdenum, iridium and chromium, each having a CTE of approximately 5 ppm/°K.). In order to match the CTE of the via 24 with the relatively low CTE of the surrounding final dielectric material 52, it may be necessary to either combine a conductive material having a high CTE with another conductive material having lower CTE in the proportion necessary to achieve the match, or combine a conductive material having a high or low CTE with a dielectric material having an even lower CTE. For example, to match the CTE of a final dielectric material comprising glass-ceramic (CTE=10 ppm/°K.), the selected conductive metalizing material may comprise a 50:50 alloy of copper (CTE=16 ppm/°K.) and tungsten (CTE=4.5 ppm/°K.) .

Accordingly, the through hole metalizing material may include metals, metal alloys, mixtures of metals and nonmetals and the like, in whatever proportion necessary to yield a CTE that matches the final dielectric material 52 and the connecting electrical components.

With respect to filling or metalizing the post holes 44, it is not necessary that the conductive material chosen have a CTE matching that of the final dielectric material 52, the interconnection substrate 12 and the integrated circuit chip or chips 26. The only requirement for the material chosen to metalize the post holes is that it be electrically conductive to facilitate the technique used to construct a via support structure 45. The conductive posts 46 function only to provide a temporary support structure to the vias 24 and are not be present in the final through-hole interconnector. After the formation of the final dielectric layer 52, the conductive posts 46 are permanently removed from the through-hole interconnector. Conductive materials that may be used to metalize the post holes 44 include pure metals and metal alloys. A preferred conductive material is copper. However, for purposes of manufacturing efficiency the material used to metalize the through holes 40 may also be used to metalize the post holes 44.

Several techniques known to those skilled in the art may be used to fill or metalize the through holes 40. However, according to practice of this invention the technique chosen should accomplish void free hermetic metalization of the through holes. A preferred technique capable of providing void free metalization of the through holes 40 is by the well known process of electroplating. In the electroplating process, the metal or alloy chosen to metalize or fill the hole typically serves as the anode which is immersed in an electrolytic bath containing ions of the metalizing material. The conductive seed layer 38 is the cathode in the plating process and is immersed into the electrolytic bath. An electrical voltage is applied between the metalizing material (anode) and the conductive seed layer 38 (cathode) which causes the metalizing material to be deposited down into the through holes 40 and onto the surface of the conductive seed layer. The metalization is complete once the through holes are filled to the surface of the dielectric layer.

Electroplating ensures void free hermetic filling of the through holes 40 because the metalizing material plates only to the cathodic portion of the hole which is initially the conductive seed layer surface and thereafter the surface of the deposited metal. The metalizing material will not be deposited or plated on the wall of the hole since each hole wall is made up of a nonconductive dielectric material. The ability to metalize the holes from the bottom up, without depositing the metalizing material about the hole wall, eliminates the occurrence of voids during metalization. Other techniques used for metalization often result in the formation of voids due to the action of the metalizing material depositing on the hole diameter, making it difficult or impossible for the metalizing metal to pass beyond the constriction to fill the bottommost portion of the hole.

Another preferred technique used to provide a void free hermetic metalization of the through holes 44 is metal organic chemical vapor deposition (MOCVD). In the MOCVD process, the materials chosen to fill the through holes (a metal organic composition) is placed in an evaporation chamber and heated to its sublimation temperature in an oxygen free atmosphere to form a vapor. The vapor is directed into a reaction chamber where it is passed over the through-hole interconnector which has been heated. The vapors lay down to form a metal film on the conductive seed layer 38 which serves as a nucleation site for the metallic vapor. The metal vapor undergoes thermal decomposition on the surface of the conductive seed layer 38, leaving a film of conductive metal which gradually builds up the hole. The metalization is complete once the through holes are filled to the surface of the dielectric layer.

MOCVD is a preferred technique for metalizing the through holes 40 because it permits the deposition of conductive materials comprising metal and non-metal compounds. Although the organic components are not good conductors, their inherently low CTE helps to offset the inherently high CTE of a conductive metal component, making their use particularly desirable in matching a CTE of the surrounding final dielectric layer 52.

An electroless plating technique may also be used to provide a void free hermetic metalization of the through holes.

FIG. 5 shows the through holes 40 and post holes 44 of the first dielectric layer 42-1 after having undergone metalization according to the practice of this invention. The vias 24 in the first dielectric layer typically have an aspect ratio of approximately 1:1 (assuming a dielectric layer thickness of approximately 25 micrometers and a through hole diameter of approximately 25 micrometers).

The dielectric layer undergoes chemical/mechanical polishing using methods well known to those skilled in the art to assure that the tops of the vias are coplaner with the top surface of the dielectric. The vias 24 of the first dielectric layer are tested for electrical conductivity using methods well known by those skilled in the art. The vias are tested in order to ensure the formation of a void free hermetic metalized via.

Figure 7:
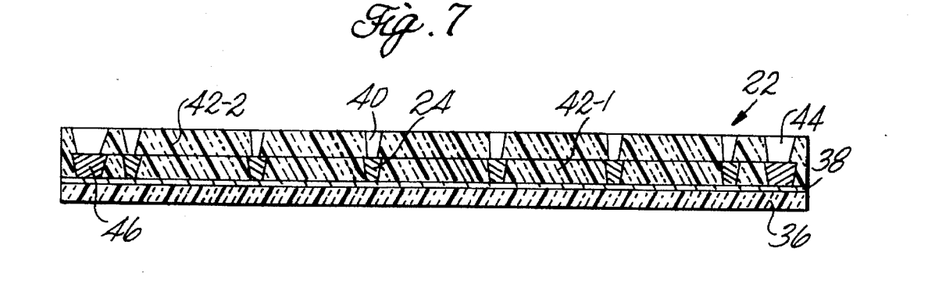
FIG. 7 is a cross sectional view of the high density through-hole interconnect substrate after a second layer has been created.

Referring now to FIG. 7, a second dielectric layer 42-2 is added to the top surface of the first dielectric layer 42-1 by one of the methods that was used to apply the first dielectric layer 42-1 to the conductive seed layer 38. Through holes 40 and post holes 44 are created in the second dielectric layer 42-1 by the same process used to create the holes in the first dielectric layer 42-1. The photo mask is placed over the surface of the second dielectric layer 42-2 and is aligned to the alignment marks which are visible from the surface of the first dielectric layer 42-1 due to the transparent nature of the first dielectric layer.

The through holes 40 and post holes 44 in the second dielectric layer are metalized with conductive material using one of the preferred techniques described for the metalization of the through holes 40 and the post holes 44 in the first dielectric layer.

After this step in the manufacturing of the high density through-hole interconnector, the through holes 40 of the preferred embodiment have an aspect ratio of approximately 2:1 (assuming that the combined thickness of the first and second dielectric layer is approximately 50 micrometers and the through hole diameter is approximately 25 micrometers). The vias 24 of the second dielectric layer are polished and are tested for electrical conductivity by the same method used to polish and test the vias 24 of the first dielectric layer.

Figure 8:
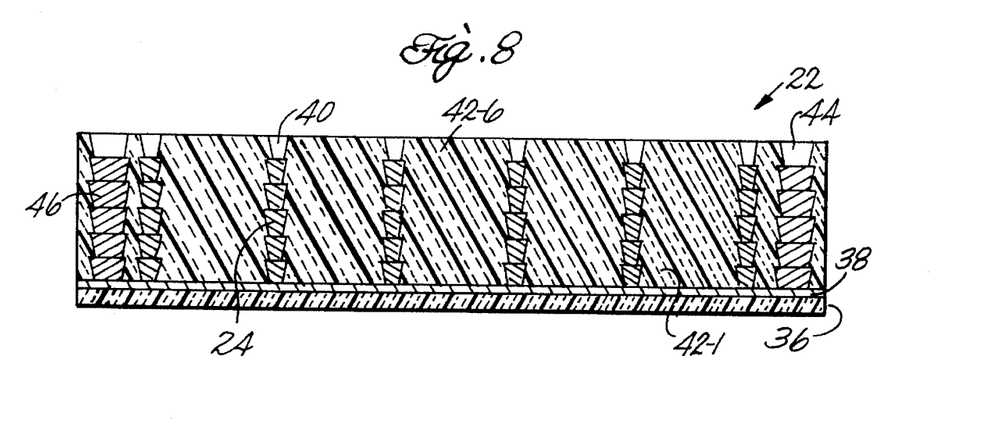
FIG. 8 is a cross sectional view of the high density through-hole interconnect substrate after multiple layers have been created.

The process of applying the dielectric layer, creating the holes, metalizing the holes, polishing the dielectric layer, and electrically testing the vias can be repeated N times according to the method of the present invention to create a multi-layer high density through-hole interconnector having a desired aspect ratio; see FIG. 8. In a preferred embodiment where both the dielectric layer thickness and the through hole diameter remains constant, the aspect ratio of the vias increases in direct proportion to the number of dielectric layers used to construct the through-hole interconnector. For example, the through-hole interconnector show in FIG. 8, which comprises six dielectric layers (each dielectric layer being approximately 25 micrometers thick and each through hole being approximately 25 micrometers in diameter) would be expected to have an aspect ratio of approximately 6:1 after metalizing the through holes 40 and post holes 44 in the sixth dielectric layer 42-6.

FIG. 8 also shows how each via 24 is configured along its length in the shape of serially arranged repeating conical sections created by the metalization of the through holes formed in successive dielectric layers by the photo etching process. High density through-hole interconnectors manufactured according to the method of the present invention may have vias 24 with aspect ratios in the range of from 1 to 10. Preferred interconnectors have vias with aspect ratios in the range of from 6 to 10.

The method of creating a via having a high aspect ratio by applying successive dielectric layers, forming the through holes by photo etching, and metalizing the through holes to form conductive vias is advantageous because it ensures alignment of each via (electrical interconnect) throughout the dielectric body. Such alignment is crucial in the manufacture of electronics, namely computers, where the density of circuits and electrical components employed to construct the computer places a premium on space. Accordingly, the interconnector used in such an application must be constructed having an accurate and precise electrical interconnect path to accommodate the connection with, and to facilitate the rapid transfer of electrical signals to and from electrical components used in such an application.

A via support structure 45 is constructed once the number of dielectric layers used to construct the through-hole interconnector yields the desired high aspect ratio. The via support structure functions to lend mechanical support to the vias 24 during the removal and replacement of the dielectric layers 42-1 through 42-N. FIG. 8 shows a top view of an in-process through-hole interconnector 22 having a desired high aspect ratio. Conductive frame members 48 are formed on the surface of the last dielectric layer 42-N and extend between and interconnect with each conductive post 46. A series of via support members 50 are also formed on the surface of the last dielectric layer 42-N. Each via support member extends between a pair of frame members 48 and interconnects with a row of vias 24 as shown by circles superimposed on the via support members in FIG. 9.

Figure 9:
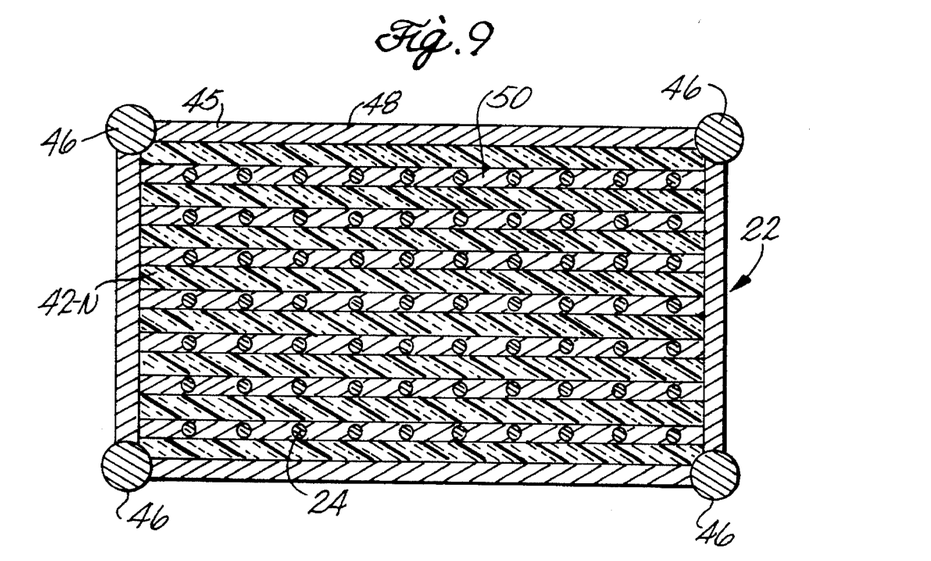
FIG. 9 is a top view of the high density through-hole interconnect substrate illustrating the via support structure.

The frame members 48 and the via support members 50 may be formed by placing a mask, having a cutout image of the frame and support members, across the surface of the last dielectric layer and depositing a conductive material through the mask. The conductive material may be deposited by well known techniques such as by sputtering, vapor deposition and the like. The conductive material chosen to form the frame members 48 and via support members 50 may include pure metals, metal alloys and the like. A preferred conductive material is copper.

The mechanical and/or electrical properties of the desired dielectric material may be such that its inclusion during the early stages of manufacturing would either encumber or prohibit altogether the manufacture of the high density through-hole interconnector of the present invention. Therefore, according to the method of the present invention, an initial or sacrificial dielectric material is used to make up the dielectric layers 42-1 through 42-N during the formation of the conductive vias 24. After the formation of the via support structure 45, the sacrificial dielectric material is removed and replaced with the final dielectric material 52 having the desired mechanical and electrical properties.

The initial or sacrificial dielectric material may be removed by several techniques well known to those skilled in the art. One technique of dielectric removal is by placing the interconnector into an asher or the like and burning off or melting away the dielectric material. Another technique is by placing the interconnector into a chemical solution and dissolving the dielectric material. FIG. 9 shows the in-process through-hole interconnector after the initial dielectric material has been removed, leaving only an interconnector frame 51 comprising the dielectric base substrate 36, the conductive seed layer 38, the vias 24, and the via support structure 45 comprising the conductive posts 46, the frame members 48 and the via support members 50.

The interconnector frame 51 is then filled with a final dielectric material 52. The final dielectric material should be electrically nonconductive, have high mechanical strength, and have a coefficient of thermal expansion approximately equal to that of the integrated circuit or other electrical component that may connect with the interconnector. The final dielectric material may be selected from the group of nonconductive materials consisting of organic or inorganic polymers, ceramics, glass, glass-ceramics, polyimide-epoxy, epoxy-fiberglass, Teflon and the like. A preferred final dielectric material is ceramic.

Figure 10:
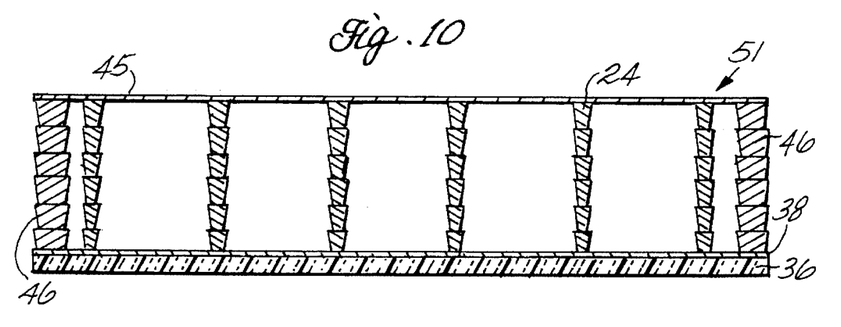
FIG. 10 is a cross sectional view of the high density through-hole interconnect substrate after the dielectric material has been removed.
Figure 11:
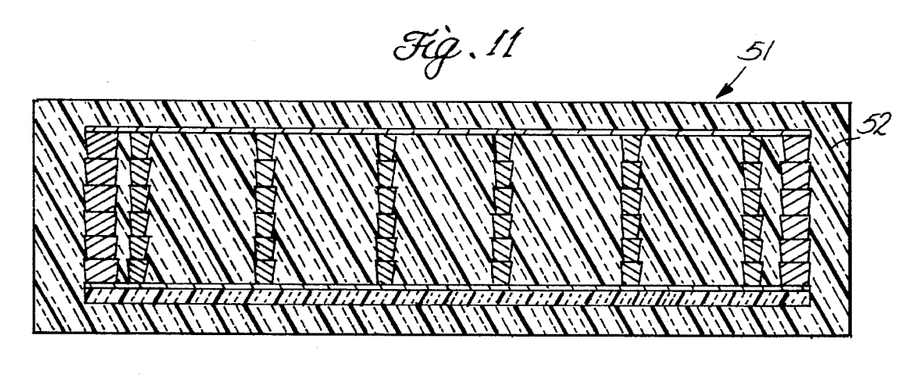
FIG. 11 is a cross sectional view of the high density through-hole interconnect substrate after the initial dielectric material has been replaced by a second dielectric.
Figure 12:
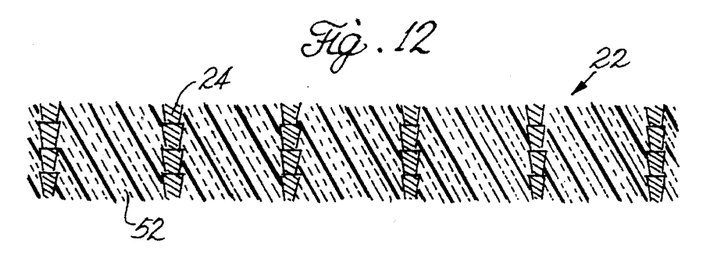
FIG. 12 is a cross sectional view of the high density through-hole interconnect substrate after the via support structure, conductive seed material and interconnecting substrate has been removed.

FIG. 10 shows the resulting block of solidified final dielectric material 52 which comprises the through-hole interconnector frame 51 having vias with a high aspect ratio. The through-hole interconnector 22 is extracted from the block by cutting or polishing away the dielectric base substrate 36, the conductive seed layer 38, the conductive posts 46, the frame members 48, and the via support members 50 using methods well known to those skilled in the art such as by precision sawing and the like. The through-hole interconnector 22 may be cut along two parallel planes to expose the ends of the vias, one cut to remove the frame members and via support members, and the other cut to remove the dielectric base substrate and the conductive seed layer; see FIG. 12. The interconnector may also be cut along at least two planes perpendicular to the two first parallel cuts to remove the conductive posts.

The through-hole interconnector 22 is lapped and polished using methods well known to those skilled in the art to the desired size and configuration to facilitate its use in a computer. The use of a rigid and mechanically strong dielectric material permits the interconnector 22 to be cut, lapped and polished to very precise dimensions using existing processes. Tolerances on the order of ¼ wavelength of light can be obtained. In a preferred embodiment, the interconnector may be approximately 400 micrometers high.

Figure 13:
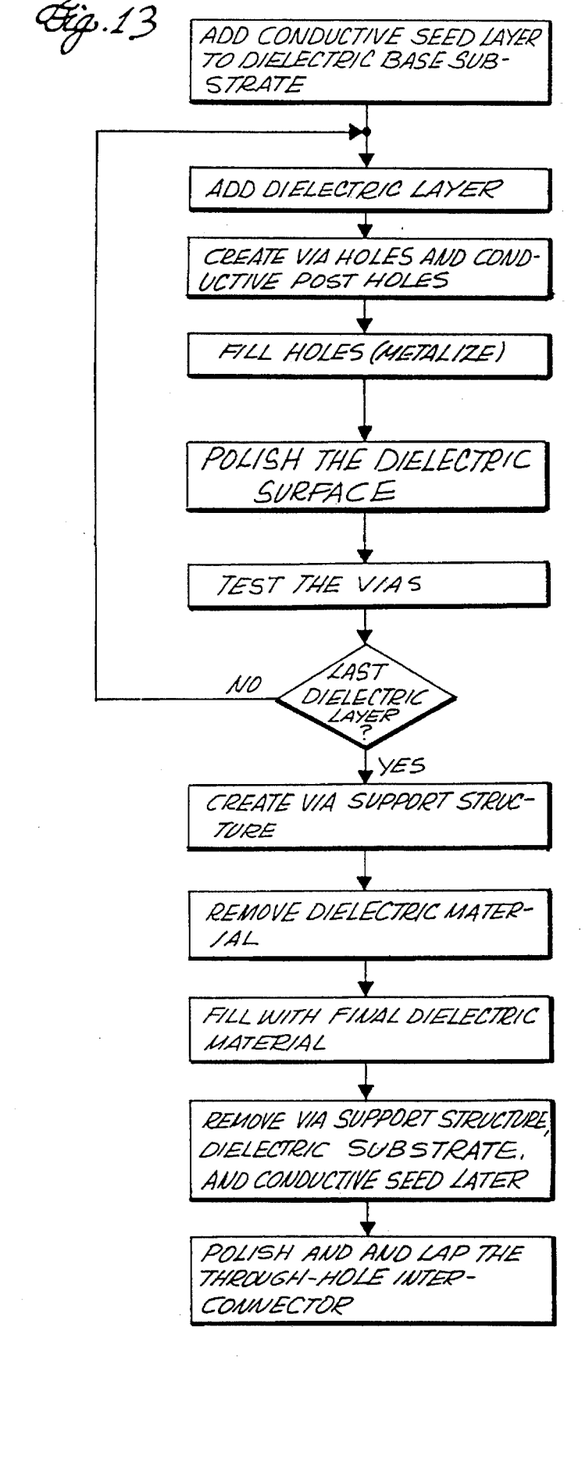
FIG. 13 is a flow chart showing the steps employed in the method of manufacturing a preferred embodiment of the high density through-hole interconnect substrate according to practice of this invention.

FIG. 13 is a flow chart summarizing the step-wise method of manufacturing a preferred embodiment of the high density through-hole interconnect according to the practice of the present invention.

It is to be understood that although only one exemplary embodiment of the high density through-hole interconnector and one method for manufacturing the same has been described and illustrated herein, many variations will be apparent to those skilled in the art. For example, the method of manufacturing a high density through-hole interconnector may be used to make interconnectors having a configuration other than rectangular, such as circular, oval, hexagonal, square and the like.

Figure 14:
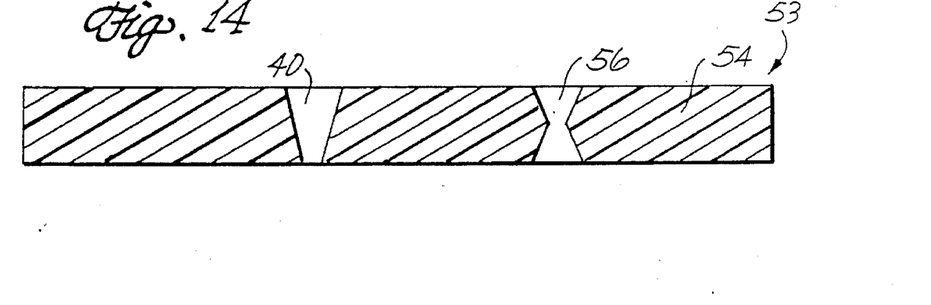
FIGS. 14 through 17 are cross sectional views of an alternative embodiment of the present invention after the processes of forming the through hole, applying the conductive layer, metalizing the through hole, and removing the conductive layer.

It is to be understood within the scope of this invention that the through holes may be manufactured having configurations different than that described in the preferred embodiment. For example, FIG. 14 shows an alternative embodiment of the through-hole interconnector 53 comprising a single dielectric layer 54 having a through hole 56 configured in the shape of an hourglass. This embodiment of the through-hole interconnector is made by subjecting both the top and bottom surface of the dielectric layer to the photo etching process of the present invention. The through holes formed by this method are metalized by applying a conductive layer 58 to the bottom surface of the dielectric substrate, as shown in FIG. 15.

Since this embodiment of the interconnector comprises only a single dielectric layer, the dielectric material chosen may have the electrical and mechanical properties desired in the final through-hole interconnector. Therefore, the conductive layer in this embodiment need only facilitate a single metalization step and need not be subjected to the process of removing and replacing the dielectric layers. Accordingly, the choice of conductive material may facilitate the manufacturing process by being relatively easy to apply and remove from the dielectric layer. Preferred conductive materials may include graphite, aluminum, conductive grease, conductive paint, conductive tape, and the like.

Figure 15:
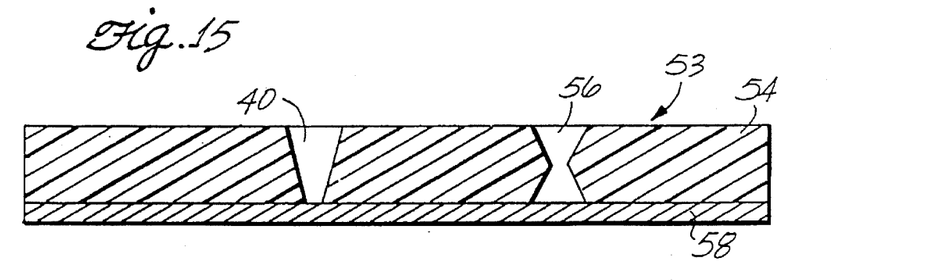

The conductive materials of this alternative embodiment can be applied to the dielectric layer 54 by the same techniques described for the application of the conductive seed layer in the preferred embodiment, such as sputtering, vapor deposition and the like, see FIG. 15. However, conductive materials such as conductive grease, conductive tape or conductive paint can be applied to the dielectric surface directly without the need for conducting further deposition processes.

Figure 16:
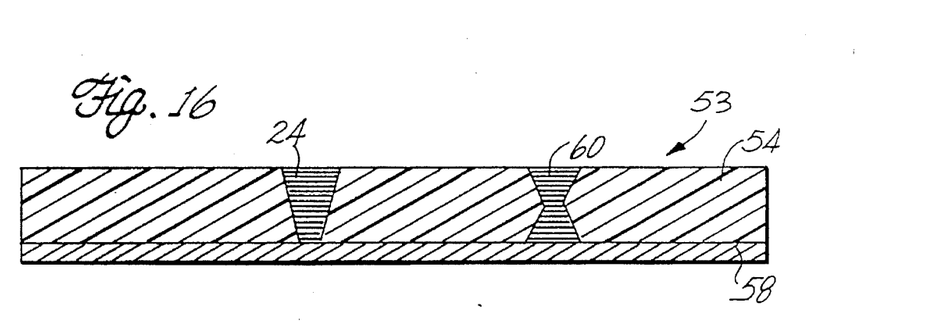

The through holes 56 of the alternative embodiment can be metalized using the same techniques described for metalizing the through holes 40 of the preferred embodiment, such as by electroplating, electroless plating and MOCVD; see FIG. 16.

Figure 17:
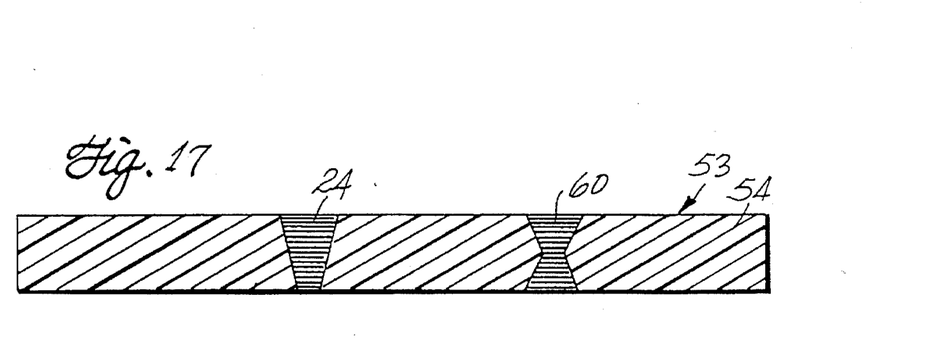

The conductive layer may be removed by methods well known by those skilled in the art, such as by selective chemical etching and the like, being careful not to etch away the vias 60 and 24; see FIG. 17. A conductive layer comprising conductive grease or conductive tape can be removed by wiping or peeling away the conductive material. The dielectric layer may undergo chemical/mechanical polishing and the vias 60 and 24 are tested for electrical conductivity to ensure void free hermetic metalization according to the present invention.

The substrate for initiating filling of the holes from the bottom up need not be a conductive layer on a nonconductive substrate. It may be a single layer of metal, for example. The only requirement of the substrate is to nucleate deposition of the conductive material so that the holes through the nonconductive material are filled from one face to the other face of the layer and not on the walls of the hole,, thereby forming conductors free from voids.

In the exemplary embodiment, the holes through each layer have an aspect ratio of about 1:1. If a laser or electron beam is used for forming the holes, a larger aspect ratio may be obtained and the number of layers for achieving a desired aspect ratio may be less.

The support structure for the high aspect ratio conductors is described as a cage with a surrounding frame and linear via support members connected to the ends of each via. It will be apparent that cross supporting members may be provided for further stiffening of the frame. It should also be apparent that the posts parallel to the vias may themselves be used as conductors in a finished interconnector instead of removed.

Since many such variations may be made, it is to be understood that within the scope of the following claims, this invention may be practiced otherwise than specifically described.

What is claimed is:

1. A method for forming a through-hole interconnector for transferring electrical signals, the method comprising the steps of:

forming an electrically conductive substrate;

forming a first nonconductive layer on the surface of the substrate;

forming a plurality of holes through the first nonconductive layer in a pattern corresponding to desired electrical conductors;

filling the holes with electrically conductive material from one face of the nonconductive layer toward the substrate;

forming a second nonconductive layer on the first nonconductive layer;

forming a plurality of holes through the second nonconductive layer in a pattern corresponding to the pattern of filled holes in the first nonconductive layer;

filling the holes in the second nonconductive layer with electrically conductive material from the filled holes toward the other face of the second layer; and forming a support structure integral with the first and second nonconductive layers, wherein the support structure interconnects with the conductive material and an end portion of each of the plurality of filled holes.

2. The method as recited in claim 1 comprising repeating the steps of forming a nonconductive layer, forming a plurality of holes in the nonconductive layer, and filling the plurality of holes until the filled holes have a predetermined aspect ratio.

3. The method as recited in claim 2 comprising removing the nonconductive material after the predetermined aspect ratio has been achieved and replacing the nonconductive material with a second nonconductive material.

4. The method as recited in claim 3 comprising removing the support structure.

5. The method for forming electrical conductors through a nonconductive substrate comprising steps of:

forming an electrically conductive substrate;

forming a first layer of nonconductive material on the surface of the substrate;

forming a first plurality of holes through the first nonconductive layer;

depositing an electrically conductive material onto the conductive material layer through each of the first plurality of holes until the holes are filled with deposited conductive material;

forming an second layer of nonconductive material on the surface of the first layer of nonconductive material;

forming a second plurality of holes through the second nonconductive layer in a pattern corresponding to the first plurality of filled holes in the first nonconductive layer so that the surfaces of the filled holes are exposed;

depositing an electrically conductive material onto the surfaces of the filled holes through each of the second plurality of holes until the holes are filled with deposited conductive material;

repeating the steps of forming a layer of nonconductive material, forming a plurality of holes, and depositing an electrically conductive material to build a plurality of filled holes;

forming a support structure integral with the nonconductive layers which interconnects with the layer of the conductive material and an end portion of each of the plurality of filled holes;

removing the nonconductive material; and replacing the nonconductive material with a second nonconductive material.

6. The method of claim 5 comprising repeating the steps a sufficient number of times to form an electrical conductor with a plurality of holes each having a ratio of hole depth to hole width in the range of from six to ten.

7. The method of claim 6 wherein the depositing step comprises depositing conductive material by a technique selected from the group consisting of metal organic chemical vapor deposition, electroless plating and electroplating.

8. The method of claim 6 comprising the step of depositing an electrically conductive material having a coefficient of thermal expansion approximately equal to that of the nonconductive material.

9. The method of claim 6 comprising forming the first, second and any successive nonconductive layer by depositing a nonconductive material by a technique selected from the group consisting of spinning, spraying and Corton coating.

10. The method of claim 6 comprising forming the plurality of holes by an etching technique selected from the group consisting of reactive ion etch, chemical etch and photo etch.

11. The method for forming electrical conductors through a nonconductive substrate comprising steps of:

forming an electrically conductive substrate;

forming a first layer of nonconductive material on the surface of the substrate;

forming a first plurality of holes through the first nonconductive layer;

depositing an electrically conductive material onto the conductive material layer through each of the first plurality of holes until the holes are filled with deposited conductive material;

forming an second layer of nonconductive material on the surface of the first layer of nonconductive material;

forming a second plurality of holes through the second nonconductive layer in a pattern corresponding to the first plurality of filled holes in the first nonconductive layer so that the surfaces of the filled holes are exposed;

depositing an electrically conductive material onto the surfaces of the filled holes through each of the second plurality of holes until the holes are filled with deposited conductive material;

repeating the steps of forming a layer of nonconductive material, forming a plurality of holes, and depositing an electrically conductive material to build a plurality of filled holes;

forming a support structure integral with the nonconductive layers which interconnects with the layer of the conductive material and an end portion of each of the plurality of filled holes;

removing the nonconductive material; and replacing the nonconductive material with a second nonconductive material.

12. The method of claim 11 comprising forming the support structure by forming a plurality of post holes through each nonconductive layer and filling the post holes to form conductive posts by depositing conductive material into the post holes.

13. The method of claim 12 comprising forming a plurality of frame members that interconnect with the conductive posts by depositing a conductive material onto a surface of the nonconductive material.

14. The method of claim 13 comprising forming a plurality of via support members that interconnect with both the frame members and the end portion of each of the plurality of filled holes.

15. The method of claim 14 comprising forming the conductive posts, frame members and via support members by depositing conductive material by a technique selected from the group consisting of sputtering, electroplating, electroless plating, vapor deposition, and metal organic chemical vapor deposition.

16. The method of claim 11 comprising removing the electrically conductive substrate and support structure after the step of replacing the nonconductive material with the second nonconductive material.

17. The method of claim 16 comprising polishing the surfaces of the second nonconductive material and the end portions of the plurality of filled holes after the step of removing the electrically conductive substrate and support structure.

18. A method for manufacturing a high density through-hole interconnector to facilitate the transfer of electrical signals, the method comprising the steps of:

forming a plurality of holes in a non-conducting layer;

applying a layer of seed material to one surface of the nonconductive layer;

filling the holes in the nonconductive layer by depositing a conductive material onto the seed material; and removing the layer of seed material.

19. A method as recited in claim 18 comprising forming the plurality of holes by etching from one surface of the nonconductive layer through the thickness of the substrate.

20. A method as recited in claim 19 comprising filling the holes with a conductive material having a coefficient of thermal expansion approximately equal to that of the nonconductive layer.

21. A method as recited in claim 20 comprising depositing the conductive material by using a deposition technique selected from the group consisting of electroplating, electroless plating and metal organic chemical vapor deposition.

22. A method as recited in claim 18 comprising forming the plurality of holes by etching from opposing surfaces of the nonconductive layer through the thickness of the substrate.

23. A method for manufacturing a high density through-hole interconnector for transferring electrical signals, the method comprising the steps of:

forming an electrically conductive substrate;

applying at least one layer of nonconductive material to the surface of the conductive substrate;

forming a plurality of holes through the nonconductive layer;

filling the plurality of holes with an electrically conductive material to form vias having a desired aspect ratio, wherein the conductive material has a coefficient of thermal expansion approximately equal to that of the nonconductive material;

repeating the steps of applying a layer of conductive material, forming a plurality of holes, and filling the plurality of holes for obtaining a selected aspect ratio of the vias;

forming a support structure integral with the nonconductive material which interconnects with the conductive substrate and an end portion of each via;

removing the nonconductive material;

replacing the nonconductive material with a second nonconductive material; and removing the support structure and the conductive substrate.

24. A method as recited in claim 23 comprising removing the layer of nonconductive material to form an interconnector frame comprising a plurality of vias, the conductive substrate and the support structure.

25. A method as recited in claim 24 comprising replacing the layer of nonconductive material with a second nonconductive material by pouring a liquid form of the second nonconductive material into the interconnector frame until the entire frame is filled with the second nonconductive material.

26. A method as recited in claim 23 wherein the steps of applying a layer of conductive material, forming a plurality of holes, and filling the plurality of holes are repeated to form a high density through-hole interconnector with a plurality of holes each having a ratio of hole depth to hole width in the range of from six to ten.

* * * * *